United States Patent [19]

Liu

[11] Patent Number: 5,448,495
[45] Date of Patent: Sep. 5, 1995

[54] MULTIFUNCTIONAL FRAME ASSEMBLY WITH FAN AND SPEAKER FOR A PERSONAL COMPUTER

[75] Inventor: Morgan C. Liu, Taoyuan, Taiwan

[73] Assignee: Enlight Corporation, Taoyuan, Taiwan

[21] Appl. No.: 217,248

[22] Filed: Mar. 24, 1994

[51] Int. Cl.⁶ .......................... G06F 1/16; H05K 7/14; H05K 7/12
[52] U.S. Cl. .................................. 361/683; 361/725; 361/825; 361/829
[58] Field of Search .................. 312/223.2; 264/708.1; 361/680–686, 724–727, 825, 829

[56] References Cited

U.S. PATENT DOCUMENTS

| | | | |
|---|---|---|---|
| 5,138,526 | 8/1992 | Chung Hsiang | 361/683 |
| 5,148,352 | 9/1992 | Sekouri et al. | 361/683 |
| 5,175,670 | 12/1992 | Wang | 361/724 X |
| 5,224,024 | 6/1993 | Tu et al. | 361/831 |
| 5,269,598 | 12/1993 | Liu | 312/223.2 |

Primary Examiner—Michael W. Phillips
Attorney, Agent, or Firm—Ladas & Parry

[57] ABSTRACT

A multifunctional frame assembly for a personal computer includes a multifunctional frame having a speaker-engaged portion and a fan-engaged portion. The speaker-engaged portion has a pair of engaging members which define an opening. The fan-engaged portion has a surface with an orifice and a pair of stoppers each being provided with a pair of engaged hooks extending longitudinally and a pair of ribs on an inner wall of the stopper. A speaker is clamped between the engaging members and in alignment with the opening. A ventilating fan with a plurality of holes at the corner region thereof is installed between the ribs and in alignment with the orifice. A chassis of the computer having an end plate is provided with engaged holes corresponding to the engaged hooks of the stoppers, wherein the frame can be positioned by engaging the engaged hooks with the corresponding engaged holes on the end plate.

7 Claims, 4 Drawing Sheets

MULTIFUNCTIONAL FRAME ASSEMBLY WITH FAN AND SPEAKER FOR A PERSONAL COMPUTER

FIELD OF THE INVENTION

This invention relates to a multifunctional frame assembly of a personal computer, particularly to a assembly having frame on which a ventilating fan and a speaker can be held without using screws and guiding blocks are disposed for providing auxiliary support when interface cards are inserted onto the motherboard.

As information industry grows rapidly, new products in this category are being developed continuously and directly to affect the market. As far as the personal computers are concerned, the quality and function thereof can be maintained on a relatively high level under intense competition. However, the conventional personal computers are still improper in structural arrangement and make use of screws for assembling each components. This would inevitably prolong the time for assembly and cause inconvenience to users during maintenance and component replacement.

SUMMARY OF THE INVENTION

In regard to the facts, the present invention is developed and focused on improving the drawbacks of conventional installations of ventilating fan and speaker, such as the inconvenience resulting from uneasy dismantlement and assembly of the components of the personal computer.

An object of the present invention is primarily to provide a multifunctional frame assembly for a personal computer, wherein a speaker-engaged portion and a fan-engaged portion are disposed on the same side of the frame. The speaker-engaged portion includes a pair of engaged members to securely hold the speaker therebetween. The fan-engaged portion includes a pair of stoppers comprising a pair of ribs on the inner walls of the stoppers respectively to clamp the ventilating fan therebetween. Furthermore, there are a pair of engaged hooks respectively extending from the stoppers so that the frame can be easily engaged with an end plate of the chassis of a computer.

A further object of the present invention is to provide a multifunctional frame assembly of a personal computer, wherein the frame is provided with a plurality of pairs of guiding blocks on one side so as to provide auxiliary support after interface cards are mounted onto the motherboard.

An another object of the present invention is to provide a multifunctional frame assembly of a personal computer in which the frame can be installed on the inner side of a front end plate of the basis of the computer. The ventilating fan disposed on the frame can co-operate with another fan for ventilating power supply to increase the efficiency of heat dissipation.

These advantages and features of the present invention will become readily apparent from the following accompanying drawings coming up with the detailed description of its structure and embodiments.

| NUMERAL REFERENCES | | | |
|---|---|---|---|
| (10) | frame | (12) | sneaker-engaged portion |
| (14) | fan-engaged portion | (20) | chassis of computer |
| (22) | speaker | (24) | ventilating fan |
| (40) | interface card | (101) | flange |
| (102) | ledge | (103) | guiding block |
| (104) | slot | (121) | engaging member |
| (122) | rib | (123) | opening |
| (140) | orifice | (141) | stopper |
| (142) | resilient piece | (143) | engaged hook |
| (144) | bead | (146) | positioning pin |
| (148) | rib | (201) | end plate |
| (202) | engaged hole | (241) | hole |

DETAILED DESCRIPTION OF THE INVENTION

Figure 1:
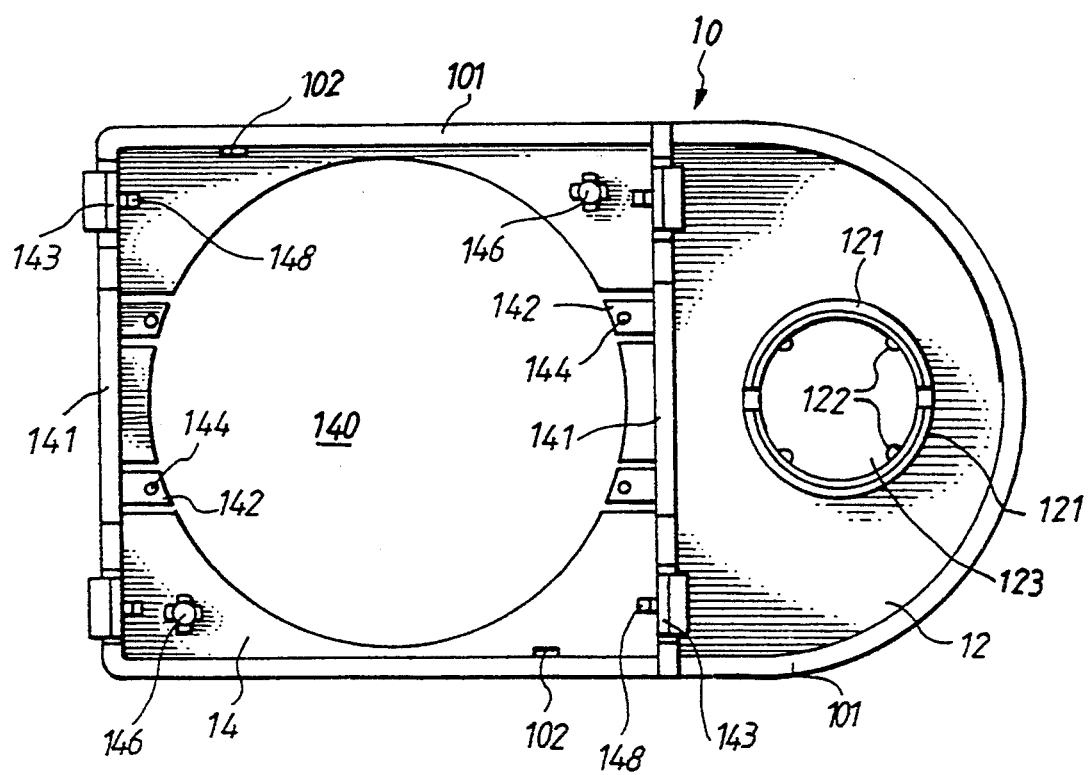
FIG. 1 is a front elevational view of the present invention.
Figure 2:
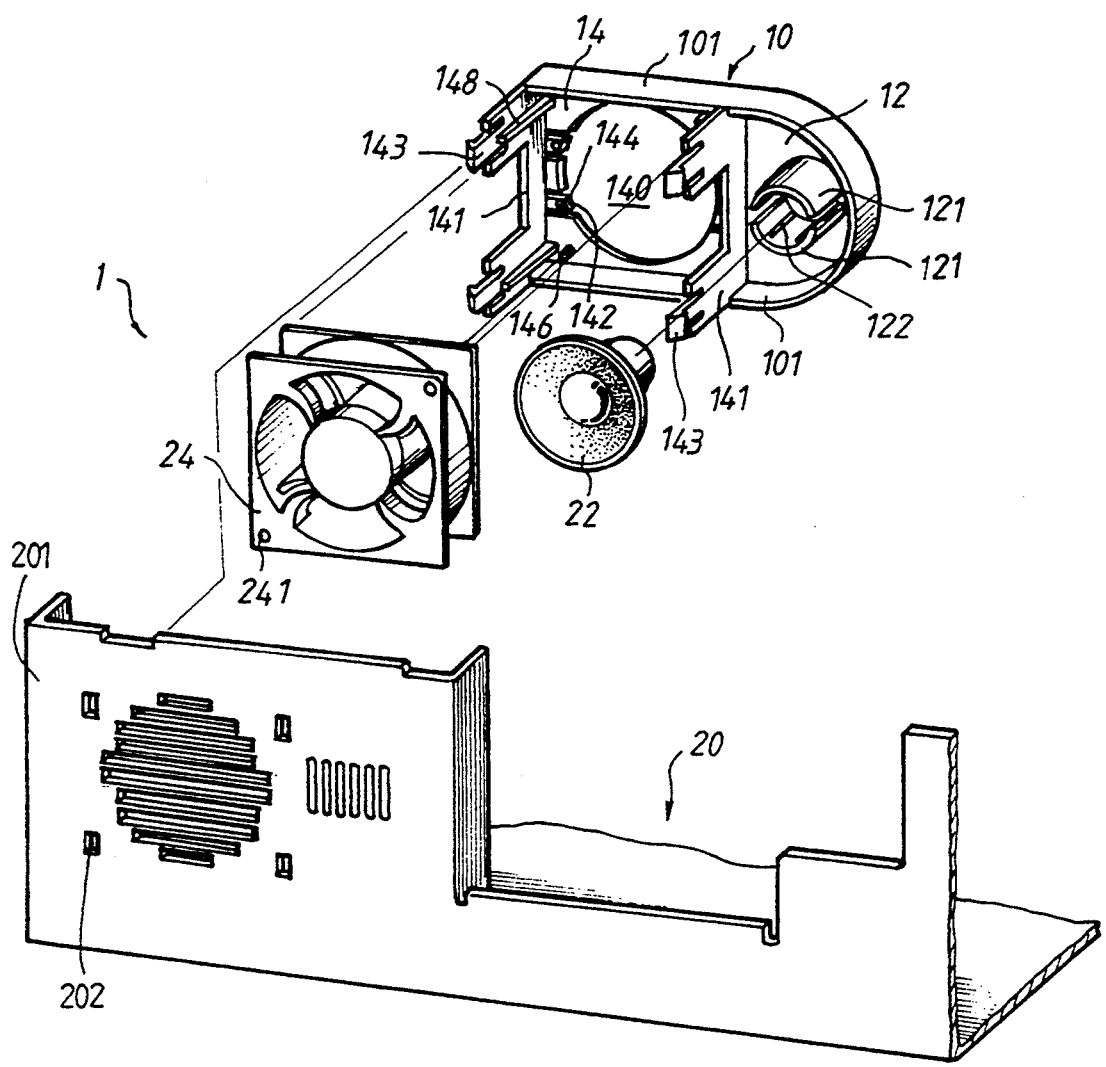
FIG. 2 is an exploded view of the present invention showing the ventilating fan, speaker and end plate of the basis of the computer.

Referring to FIGS. 1 and 2, a multifunctional frame assembly 1 includes a multifunctional frame 10 which is generally in the construction of a shallow disk from which flanges 101 circumferently and upwardly project. Preferably, the frame 10 is made of plastic material and comprises a speaker-engaged portion 12 and a fan-engaged portion 14 on the same side thereof. The speaker-engaged portion 12 includes a pair of engaging members 121 for defining an opening 123, the engaging members are arc pieces with at least a rib 122 on its inner surface. The fan-engaged portion 14 is provided with an orifice 140 at its central region. In regard to the overall area of the fan-engaged portion 14, the orifice 140 occupies a relatively large proportion to accommodate a ventilating fan 24 so as to provide the best heat dissipation. The fan engaged portion 14 includes two stoppers 141 which are respectively disposed at both sides of the orifice 140 and positioned between the flanges 101 facing each other. Each of the stoppers 141 is provided with a pair of engaged hooks 143 and a pair of ribs 148 corresponding to the engaged hooks 143 on the inner wall of the stopper 141. The fan-engaged portion 14 further includes a pair of resilient pieces 142 disposed between the orifice 140 and the stopper 141, and each resilient piece 142 is provided with a bead 144 on its surface. A pair of positioning pins 146 in generally cross-tapered shape are disposed diagonally on the surface of the fan-engaged portion 14.

Figure 3:
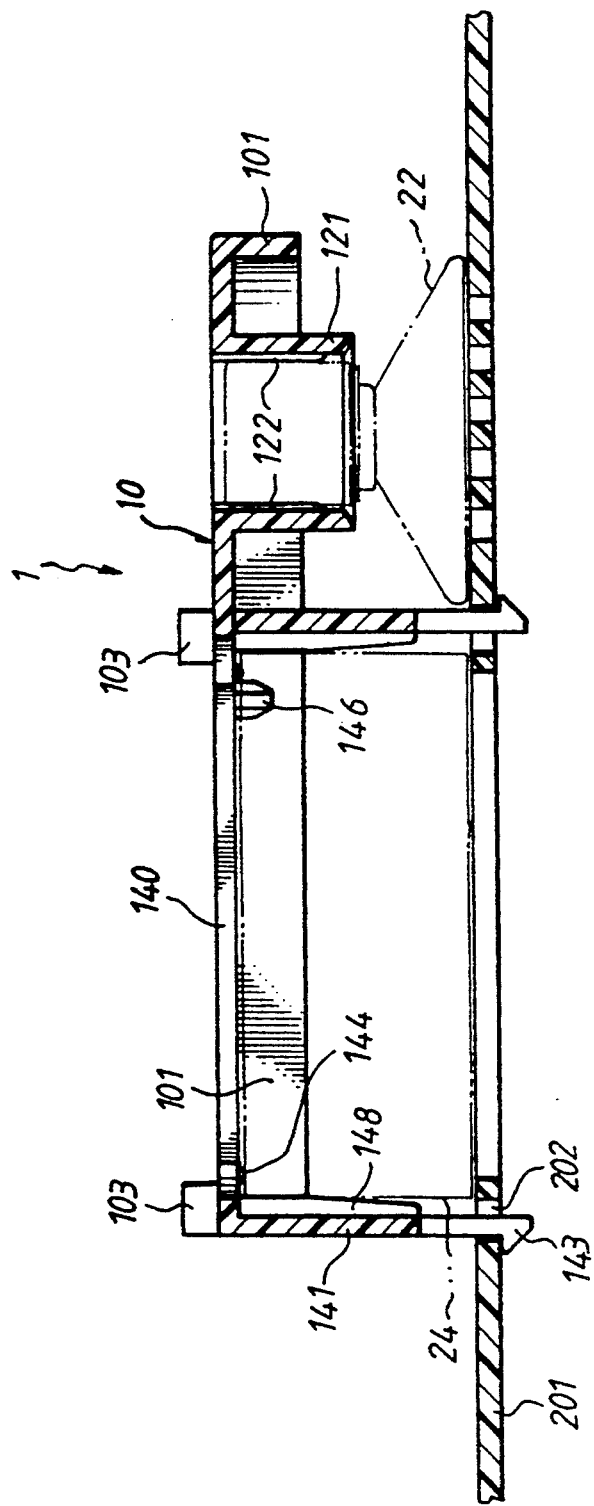
FIG. 3 is a top cross-section view of the present invention as the multifunctional frame is engaged with the end plate of the basis of the computer.
Figure 4:
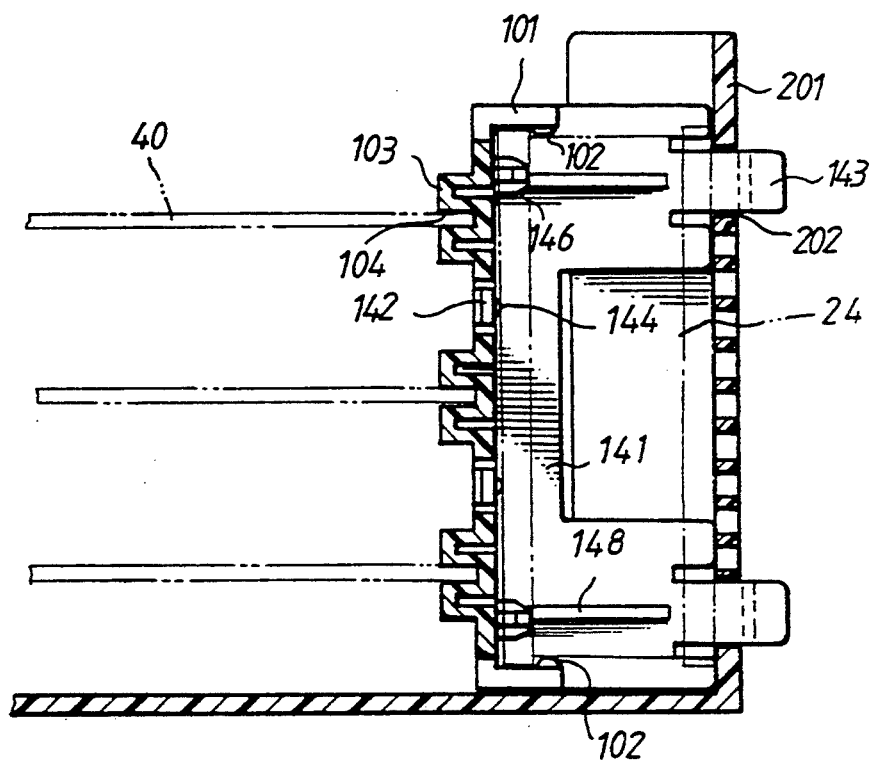
FIG. 4 a side cross-section view of the present invention as the multifunctional frame is engaged with the end plate of the basis of the computer.

Referring to FIGS. 3 and 4, a speaker 22 can be securely clamped between the engaging members 121 which are somewhat resilient since they are designed as two-separated pieces together with the ribs 122 disposed on the inner surface thereof. The ventilating fan 24 is disposed between the ribs 148 on the inner surface of the stoppers 141, wherein the distance between the ribs 148 is sufficient for fitting and contacting with the outer edge of the ventilating fan 24 so that the fan 24 can be clamped therebetween. Preferably, the surface of the rib 148 is provided with a locally beveled region from the top edge thereof so as to guide the ventilating fan 24 in position. The positioning pins 146 disposed on the surface of the fan-engaged portion 14 will be respectively inserted into holes 241 disposed adjacent to the corners of the ventilating fan 24 to further securely position the ventilating fan 24 as it is installed. In addition, the inner side of each flange 101 of the fan-engaged portion 14 is provided with a ledge 102 so that the ledges 102 can snapply engage with the edge of the ventilating fan 24 (as shown in FIG. 4) after the ventilating fan 24 is installed in the fan-engaged portion 14 so as to prevent the ventilating fan 24 from dropping outwardly and to facilitate the assembly of the frame 10 on an end plate 201 of the basis of computer 20.

The end plate 201 is provided with four engaged holes 202 arranged squarely and corresponding to the positions of the engaged hooks 143 of the frame 10. When the frame 10 is to be installed, the engaged hook 143 should be in alignment with and then inserted into the engaged hole 202 of the end plate 201. Meanwhile, the front edge of the hooks 143 will be in contact with the surface of the end plate 201 first and then be inwardly deflected until each said hook 143 passes through the corresponding engaged holes 202. As a result, the hooks 143 will return to the original positions due to their own resilient property for positioning the frame 10.

The front and rear surfaces of the ventilating fan 24 are in contact with the inner wall of the end plate 201 and the surface of the fan-engaged portion 14 respectively, and therefore press the bead 144 of the resilient piece 142 to force the resilient piece 142 to slightly bend outwardly. The engagement between the frame 10 and the end plate 201 is thus more secure due to the reaction force produced by the resilient piece 142. When the frame 10 is to be dismantled, it is only required to press the engaged hooks 143 to separate them from the end plate 201. Therefore, the present invention is indeed a novel frame which can readily be dismantled and assembled. In addition, the rear surface of the frame 10 is provided with a plurality of pairs of guiding blocks 103, each pair of the guiding blocks 103 define a slot 104 therebetween. While interface cards 40 are inserted onto the motherboard (not shown), one end of each said interface card 40 is inserted into the slot 104 so as to provide auxiliary support for the interface cards 40.

The structure and features of the present invention are clearly revealed from the aforesaid detailed descriptions and drawings. It has to be realized that the preferred embodiment is provided to explain the better operational conditions of the present invention rather than to restrict the scope thereof. Any modification and variation may be made by the person skilled in the art without departing from the spirit and scope of this invention.

I claim:

1. A multifunctional frame assembly for a personal computer comprising a multifunctional frame having a speaker-engaged portion and a fan-engaged portion, said speaker-engaged portion having a pair of engaging members which define an opening, said fan-engaged portion having a surface with an orifice and a pair of stoppers each being provided with a pair of engaged hooks extending longitudinally and a pair of ribs on an inner wall of said stoppers; a speaker being clamped between said engaging members and in alignment with said opening; a ventilating fan with a plurality of holes at a corner region thereof being installed between said ribs and in alignment with said orifice; and a chassis of the computer having an end plate which is provided with engaged holes corresponding to the engaged hooks of the stoppers; wherein said frame can be positioned by engaging said engaged hooks with the corresponding engaged holes on the end plate.

2. The multifunctional frame assembly of claim 1 wherein said engaging member is an arc piece with at least a rib on an inner wall thereof.

3. The multifunctional frame assembly of claim 1 wherein each said rib of said stoppers is provided with a locally beveled region from the top edge thereof.

4. The multifunctional frame assembly of claim 1 wherein said frame comprises a pair of resilient pieces extending horizontally from said inner walls of said stoppers, each said resilient piece being provided with a bead on a surface of the resilient piece.

5. The multifunctional frame assembly of claim 1 wherein the surface of said frame is provided with a plurality of positioning pins corresponding to the holes of said ventilating fan for engagement.

6. The multifunctional frame assembly of claim 1 wherein said frame includes an upward flange along the circumference thereof and a plurality of ledges are longitudinally disposed on inner surfaces of said flange.

7. The multifunctional frame assembly of claim 1 wherein a rear surface of said frame is provided with at least a pair of guiding blocks, and each pair of the guiding blocks defining a slot therebetween.

* * * * *